US009322681B2

(12) United States Patent
Cowles et al.

(10) Patent No.: US 9,322,681 B2
(45) Date of Patent: Apr. 26, 2016

(54) DETERMINE INSTALLATION OF COMPONENTS BASED ON PERFORMANCE CHARACTERISTICS

(75) Inventors: David R Cowles, Granite Bay, CA (US); Rajeev Grover, Rocklin, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 941 days.

(21) Appl. No.: 13/307,132

(22) Filed: Nov. 30, 2011

(65) Prior Publication Data

US 2013/0138364 A1 May 30, 2013

(51) Int. Cl.
| G01F 1/00 | (2006.01) |
| G06F 15/00 | (2006.01) |
| G06F 1/20 | (2006.01) |
| G01R 31/40 | (2014.01) |

(52) U.S. Cl.
CPC *G01F 1/00* (2013.01); *G06F 1/206* (2013.01); *G06F 15/00* (2013.01); *G01R 31/40* (2013.01)

(58) Field of Classification Search
CPC ........... G06F 1/20; G06F 1/203; G06F 1/206; G06F 1/00; A61L 9/122; B01D 46/10; B01D 2279/45; B01D 46/0086; B01D 2273/30
USPC ......... 702/45, 64, 182; 361/679.48, 688, 690, 361/694–695; 454/184; 700/300; 73/1.16
See application file for complete search history.

(56) References Cited

U.S. PATENT DOCUMENTS

| 4,240,072 A | 12/1980 | Fowler |
| 4,977,375 A | 12/1990 | Toth |
| 6,023,138 A | 2/2000 | Fried et al. |
| 6,582,295 B1 | 6/2003 | Abouchaar |
| 6,842,117 B2 | 1/2005 | Keown |
| 7,751,990 B2 | 7/2010 | Kerrigan et al. |
| 2004/0263341 A1 | 12/2004 | Enzinna |
| 2005/0128700 A1* | 6/2005 | Alperin et al. ................. 361/687 |
| 2009/0097202 A1* | 4/2009 | Gipson ......................... 361/695 |
| 2011/0052774 A1 | 3/2011 | Sajjad et al. |
| 2011/0103901 A1 | 5/2011 | Hetcher et al. |
| 2011/0144826 A1 | 6/2011 | Hsiao |
| 2011/0197761 A1 | 8/2011 | Matsuzaki et al. |
| 2011/0316706 A1* | 12/2011 | Cash et al. .................... 340/584 |

FOREIGN PATENT DOCUMENTS

| JP | 8257332 | 10/1996 |
| JP | 2005017547 | 1/2005 |

OTHER PUBLICATIONS

John M Hogan, The Effect of Fan-Reliability and Cooling-Performance on Electronic-Chassis Reliability, Mar. 1993, IEEE Transactions on Reliability, vol. 42, No. 1, pp. 172-174.*

* cited by examiner

*Primary Examiner* — Toan Le
(74) *Attorney, Agent, or Firm* — Hewlett Packard Enterprise Patent Department

(57) ABSTRACT

A fan of a computing system is associated with a performance characteristic. It may be determined whether a component associated with the computing system is installed based on the performance characteristic.

15 Claims, 6 Drawing Sheets

DETERMINE INSTALLATION OF COMPONENTS BASED ON PERFORMANCE CHARACTERISTICS

BACKGROUND

A computing system may be associated with various components to be installed. A component may be required for the computing system to operate, and may be optional for the computing system to operate. The computing system may be impaired if operated when configured improperly, including operating the computing system with or without a component, or with an improperly installed component.

BRIEF DESCRIPTION OF THE DRAWINGS/FIGURES

DETAILED DESCRIPTION

A computing system may be associated with air filters, system panels, and other components that may be installed on the computing system. The computing system may operate differently depending on what components are installed. For example, a computing system may ensure proper cooling by increasing fan speed to compensate for additional back-pressure of installed air filters. Similarly, a computing system may adjust fan speed to compensate for a disturbed airflow path (e.g., missing system panel or open computer case) to ensure proper operation without overheating. Thus, the computing system may use a controller and/or other sensors to identify performance characteristics of the fan, determine how the performance characteristics correspond to system/fan/component behaviors, and determine whether a component is installed and whether the operation of the fan or other system aspects should be adjusted.

Figure 1:
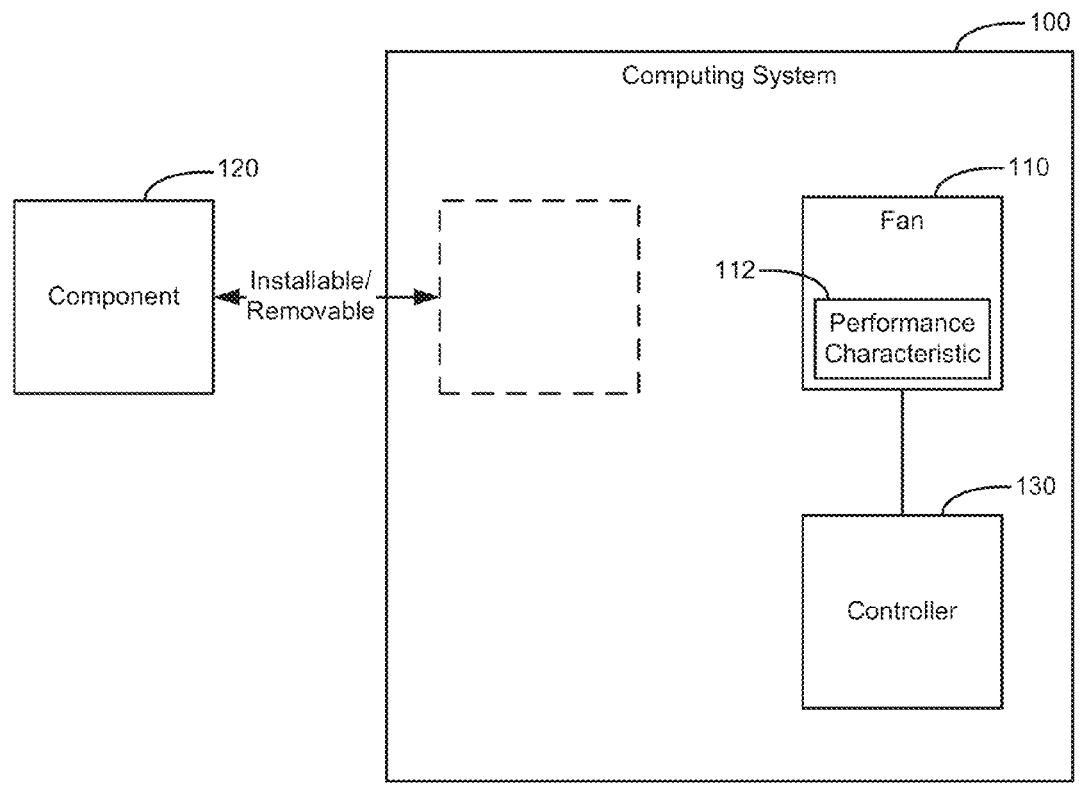
FIG. 1 is a block diagram of a computing system according to an example.

FIG. 1 is a block diagram of a computing system 100 according to an example. The computing system 100 may include a fan 110, an installable component 120, and a controller 130. The controller 130 may communicate with fan 110, and may send and/or receive performance characteristic(s) 112 associated with the fan 110. Based on the performance characteristic 112, the controller 130 may determine whether the component 120 is installed in and/or removed from the computing system 100.

Computing system 100 may include a personal computer, a server, a network switch, and other systems capable of identifying performance characteristic(s) 112. Computing system 100 may be a stand-alone module (e.g., microcontroller) that may interface with a network switch or other device.

Controller 130 may be a processor such as a Central Processing Unit (CPU), and may be a processing module including at least one processor. In an example, controller 130 may be a CPU of a network switch that is to interface with fan 110 to send and/or receive performance characteristics 112.

Fan 110 may provide fluid (air and/or liquid) flow, may provide cooling for the computing system 100, and may include a pump. Fan 110 may be associated with various performance characteristics 112 such as Revolutions Per Minute (RPMs), power, voltage, current, duty cycle, and the like. Performance characteristics 112 may be affected by whether component 120 is installed in computing system 100.

Component 120 may include an air/liquid/fluid filter, an opacity shield (e.g., a louver that may affect and/or restrict airflow and may or may not perform air filtration), a system panel, or other component that may affect fan 110. Component 120 may be optional, such that computing system 100 may be operated normally without installation of component 120. Multiple components 120 may be used in combination, e.g., combining a filter component and an opacity shield component, such that individual and/or cumulative restrictions on air flow by each component are detectable. Controller 130 may identify performance characteristic(s) 112 during operation of fan 110, determine whether component 120 is installed, and/or adjust operation of fan 110. Controller 130 may adjust operation of fan 110 to compensate for variations in usage and/or configuration of computing system 100, ensuring that proper cooling performance is achieved and/or maintained in a variety of usage scenarios.

In an example, computing system 100 may be operated with or without component 120 (an air filter), depending on factors associated with the computing system such as the installation environment. Controller 130 may determine that performance characteristic 112 of fan 110 indicates that component 120 is not installed, and operate fan 110 according to a first set of operational parameters such as a lower RPM. Controller 130 may determine that performance characteristic 112 indicates that component 120 is installed, and operate fan 110 according to a second set of operational parameters such as a higher RPM. Thus, the second set of operational parameters may compensate for any airflow restriction associated with installation of the component 120 (e.g., an air filter, opacity shield, or other components), enabling operational performance of computing system 100 regardless of whether component 120 is installed or removed.

Figure 2:
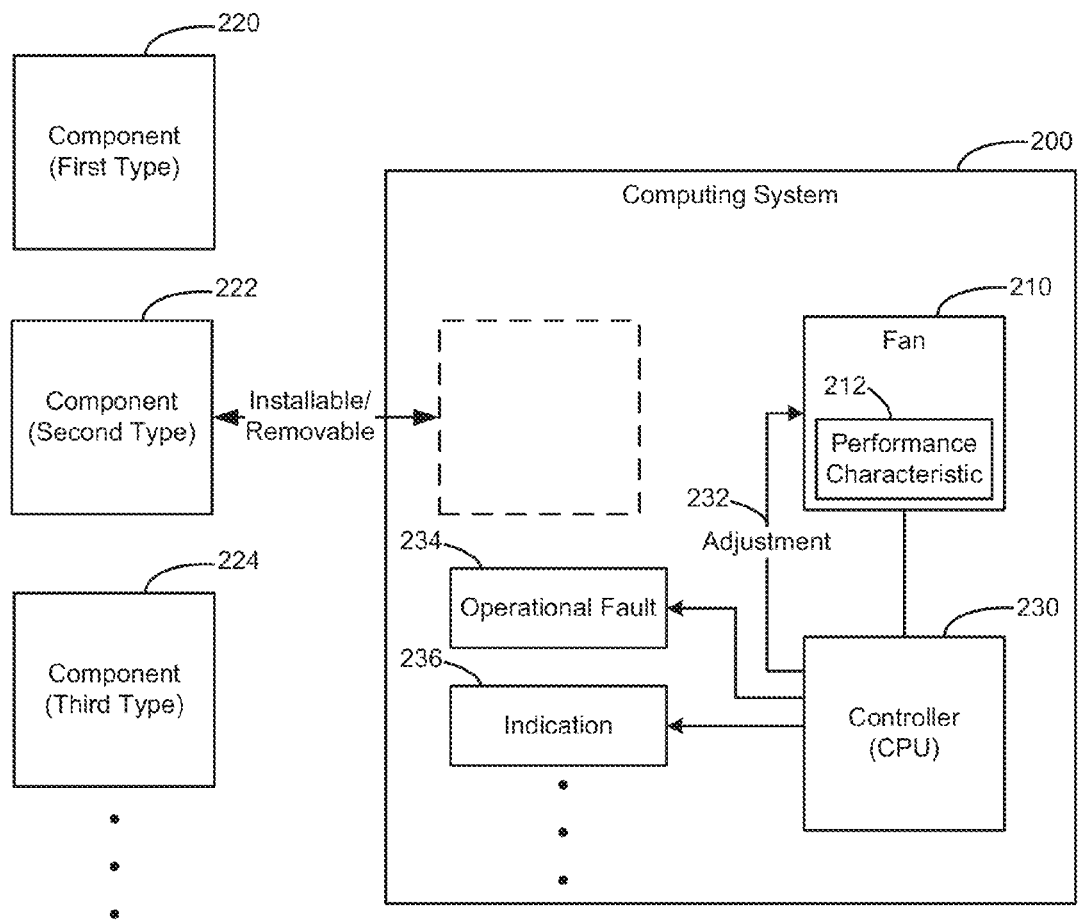
FIG. 2 is a block diagram of a computing system according to an example.

FIG. 2 is a block diagram of a computing system 200 according to an example. The computing system 200 may include a fan 210, installable components 220, 222, and 224 (and other components, not shown), and controller 230. The controller 230 may communicate with fan 210, and may send and/or receive performance characteristic(s) 212, adjustment(s) 232, and other communications associated with the fan 210. The controller 230 also may generate operational fault(s) 234, indication(s) 236, and other communications associated with the controller 230. Based on performance characteristic(s) 212, the controller 230 may determine whether at least one component is installed in the computing system 200, which type of component(s) among multiple possible components are installed, whether an operational fault is present, and other features.

Components may include a first type 220, a second type 222, a third type 224, and other types. In an example, the first type 220 may be an air filter having a first capacity of air filtration and/or opacity (e.g., ability to block light passage). The second type 222 may be an air filter having a greater capacity of air filtration and/or opacity. The third type 224 may be an air filter having an even greater capacity of air filtration and/or opacity. Additionally, components may include system panels or other features that affect airflow to, and/or operation of, fan 210. Components 220, 222, 224 also may include components that affect power usage, and thereby may indirectly affect operation of fan 210 regardless of available airflow, by virtue of affecting overall power usage including scenarios where total available power is limited and/or conserved.

In an example, installation of a high-power component 220 may cause supply voltage droop and corresponding RPMs of fan 210 to be reduced. For example, a Pulse Width Modulated (PWM) fan may receive a lower than expected voltage for a desired RPM and PWM duty cycle, resulting in a lowered RPM than expected for that duty cycle. In response to detecting installation of such a component 220 (e.g., by detecting reduced RPMs or other change in performance characteristics 212), controller 230 may provide adjustment 232 to, e.g., increase a duty cycle of fan 210 to ensure proper RPMs of fan 210 and proper operation of computing system 200. Controller 230 may be coupled to interact with at least one installed component 220, 222, 224, and so on, and may adjust power parameters or other characteristics associated with the components, fan 210, controller 230, and other aspects of computing system 200.

Controller 230 may identify a performance characteristic 212 associated with the fan 210, and provide adjustment 232 to the fan 210. Controller 230 may identify a variety of performance characteristics 212 associated with the fan 210, and may provide a variety of adjustments 232 to the fan 210. Computing system 200 may include detection circuitry (not shown) to identify performance characteristic 212 and communicate with controller 230.

Controller 230 also may provide additional features, such as an identification of an operational fault 234, as well as indications 236. For example, controller 230 may provide an indication 236 that a component 220 is installed. Indications 236 may include lights, text, sounds, or other feedback that may communicate status information. The operational fault 234 may indicate that performance characteristics 212 do not correspond to acceptable scenarios. For example, operational fault 234 may be associated with a fan 210 that is stuck, not spinning within an acceptable range of RPMs, not within an acceptable range of currents/voltages, or other faults 234. Operational fault 234 also may indicate that computing system 200 is not configured properly, including an open case, power supply issue, or system panel that affects fan 210 via airflow/back pressure, or an electrical source/load configuration of computing system 200 that affects fan 210.

Controller 230 may provide adjustment(s) 232 to affect operation of fan 210. For example, adjustment 232 may cause fan 210 to operate at a lower RPM when a component is not installed, and cause fan 210 to operate at a higher RPM when a component is installed. Adjustment 232 may be based on adjustment of an RPM, a current, a voltage, a duty cycle, and/or other parameters. Performance characteristic 212 may be a different parameter than adjustment 232. In an example, controller 230 may monitor a performance characteristic 212 such as RPM, and provide an adjustment 232 such as voltage. The controller 230 may determine different types of operational and/or configuration scenarios based on fan 210 responding to varying adjustments 232. For example, controller 230 may identify/monitor operational performance characteristics 212 of fan 210 associated with adjustments 232 to the fan power (voltage and/or current), RPMs, duty cycles, and other characteristics.

Controller 230 may be associated with information corresponding to various fans 210, components 220, 222, 224, and other aspects of computing system 200. For example, controller 230 may be associated with information for a particular fan 210, e.g., based on performance characteristic(s) 212 or other parameters such as a flow-current relationship of the fan 210. Controller 230 may, therefore, provide adjustment 232 specifically suited to a particular fan 210. Similarly, controller 230 may be associated with information for a particular computing system 200, e.g., based on attributes such as a flow-pressure curve associated with a specific computing system 200 and its various configurations (e.g., when all system panels are installed). Such information may be pre-programmed, updated periodically, learned/trained by operation of computing system 200, and otherwise associated with controller 230. Characterizations associated with computing system 200, and/or other aspects of computing system 200, may be based on detectable ranges. Thus, controller 230 may detect and identify the characterizations associated with computing system 200. Such detection/identification information may be based on information associated with the controller 230, and may also be obtained/learned/trained by the controller 230 without a need for pre-existing information.

Controller 230 may monitor performance characteristic(s) 212 and other aspects of computing system 200 to determine operational parameters associated with computing system 200, e.g., RPMs vs voltage over a range of voltages. The controller 230 may issue at least one adjustment 232, and monitor performance characteristics 212 and other attributes over time to determine any changes. The controller 230 may use a feedback loop or other control mechanism to obtain information associated with computing system 200. The controller 230 may be programmed with information corresponding to a specific fan 210 (e.g., flow-pressure curve, flow-current curve, etc.) and/or system (e.g., flow-pressure curve with component installed, flow-pressure curve without component installed).

Controller 230 may monitor performance characteristic(s) 212 to determine the various effects caused by at least one component 220, 222, 224 being installed or not installed. The controller 230 may learn whether a component 220, 222, 224 is installed and adjust operational parameters accordingly. The controller 230 may provide an indication 236 requesting that a first component 220 be installed so that the controller 230 may learn performance characteristic(s) 212 associated with that component 220. Thus, the controller 230 may interactively train itself to recognize various different types of components, without requiring pre-existing knowledge of the specific components.

The controller 230 may recognize when performance characteristics 212 are within or outside of at least one acceptable range of values, and whether or not the performance characteristics 212 are associated with a component 220, 222, or 224. Accordingly, the controller 230 may use sensors or other techniques of monitoring performance characteristics 212 to identify/determine changes in the performance characteristics 212. Thus, computing system 200 may successfully identify whether a component is installed (and what type) based on use of economical components having a relaxed degree of precision/accuracy, without a need for highly precise and/or accurate components. For example, controller 230 may identify whether a component 220 is installed based on a change in performance characteristic(s) 212 of, e.g., an operational current of 30 milliamps. Thus, controller 230 may use a sensor to monitor current that is sensitive to the nearest third of an amp, without needing a current sensor that is sensitive down to the nearest milliamp. Computing system 200 may, therefore, be economically manufactured and operated, due to the ability of the controller 230 to identify performance characteristics 212 that fall generally within a broad range of values, without a need to identify specific, highly precise and discrete values.

Adjustment(s) 232 (to fan 210 and/or other components of computing system 200) may be performed automatically by controller 230. For example, controller 230 may identify performance characteristics 212 associated with installation of first component 220, and determine that fan 210 should be operated at increased current. Controller 230 may automatically provide adjustment 232 and increase current to fan 210. Controller 230 may provide an indication 236 that installation of component 220 was determined, and that adjustment 232 was provided. Additionally, controller 230 may provide an indication 236 prompting for acknowledgement of the determination and/or requesting user input/confirmation or other action.

Adjustment(s) 232 also may be performed manually. For example, controller 230 may determine installation of component 222, and provide an indication 236 prompting a user to confirm whether to send adjustment 232 to increase RPMs of fan 210 to compensate for installation of component 222. The controller 230 may include a timeout to default to the prompted selection and/or shut down the computing system 200 (or take other action such as throttle the controller/CPU 230 and/or other components of computing system 200).

Figure 3:
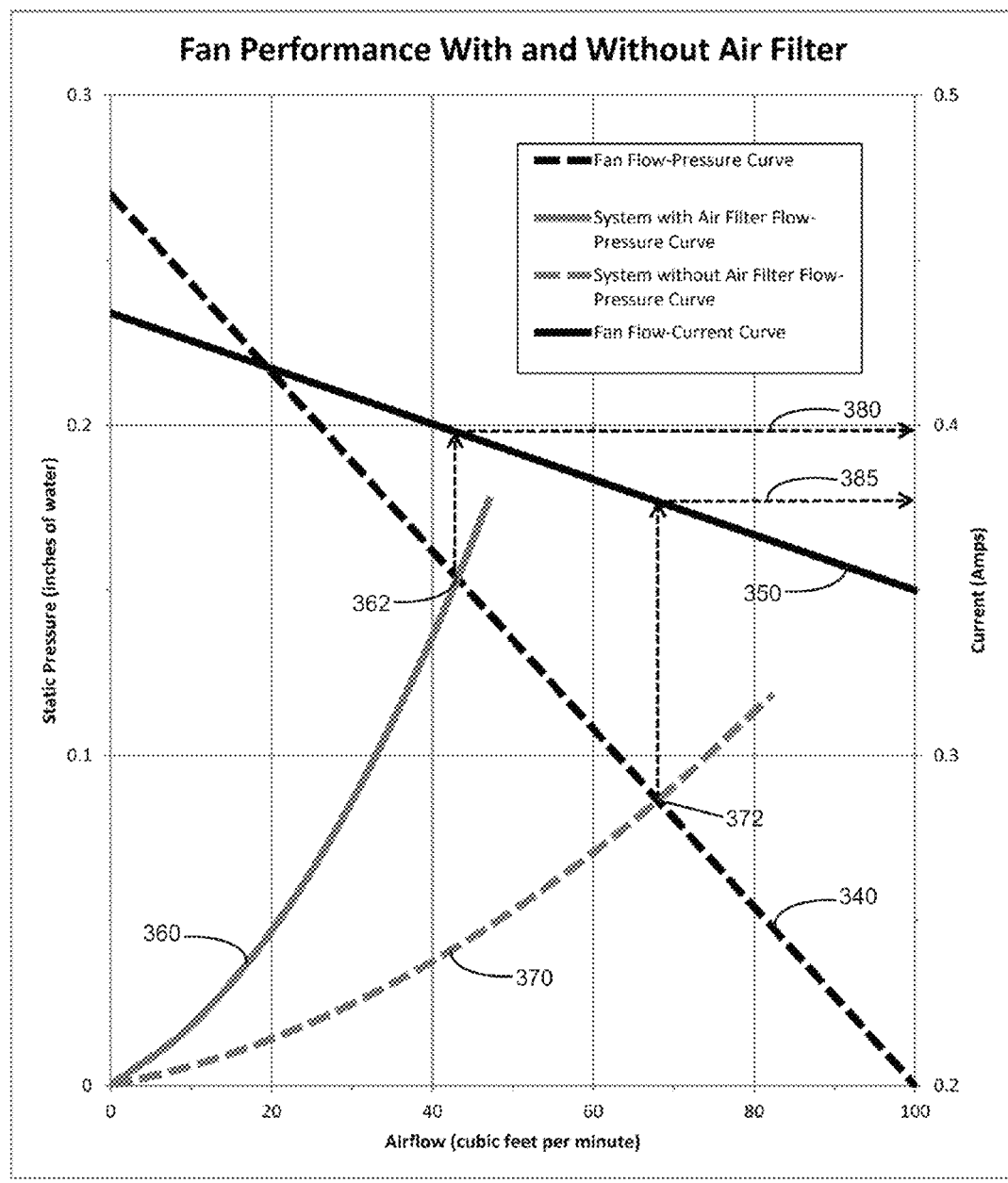
FIG. 3 is a chart based on fan performance according to an example.

FIG. 3 is a chart based on fan performance according to an example including a removable air filter component and a fan. The component (fan) may be associated with particular performance curves 340, 350, and the computing system similarly may be associated with particular performance curves 360, 370. Thus, a controller may determine whether a component is installed (and which type of component) based on performance characteristics (e.g., current) and how the component and system curves interact with each other.

The example fan is associated with a fan flow-pressure curve 340, and a fan flow-current curve 350. As shown, the fan flow-pressure curve 340 is shown approximated as linear for simplicity, corresponding to a static pressure of 0.27 inches of water at an airflow of zero (0) cubic feet per minute, and a static pressure of zero (0) inches of water at an airflow of 100 cubic feet per minute. However, the fan flow-pressure curve 340 may be nonlinear and may include random deviations or other characteristics unique to a specific fan. Curves described herein may include similar nonlinear characteristics, including curves that are random and do not follow a described mathematical path. Curves may follow a general pattern or appearance, and may include other characteristics not specifically illustrated or described. The fan flow-current curve 350 also is shown approximated as linear for simplicity, corresponding to a current of 0.434 amps at an airflow of zero (0) cubic feet per minute, and a current of 0.350 amps at an airflow of 100 cubic feet per minute. The fan flow-pressure curve 340 and the fan flow-current curve 350 are characteristics of a particular fan, such that a different fan may have different curves, may include nonlinear characteristics or random behavior, and may behave generally according to approximations (e.g., a curve may generally move up or down depending on specific characteristics of a specific fan/component). Accordingly, a controller/computing system may identify a particular component curve, and therefore a particular fan/component, by varying input adjustments (e.g., current) and identifying the responsive performance characteristics.

The curve 360 is a system flow-pressure curve with a component installed, and may be particular to a given computing system and a given installed component. Curve 360 is approximately quadratic, with airflow in cubic feet per minute of 0, 10, 20, 30, 40, and 47 corresponding to pressures in inches of water of 0, 0.0181, 0.0468, 0.0861, 0.136, and 0.177237, respectively. The curve 370 is for a system flow-pressure curve without the component installed, and may be particular to the computing system. Curve 370 is approximately quadratic, with airflow in cubic feet per minute of 0, 10, 20, 30, 40, 50, 60, 70, and 82 corresponding to pressures in inches of water of 0, 0.00586, 0.01408, 0.02466, 0.0376, 0.0529, 0.07056, 0.09058, and 0.1177192, respectively. A controller may interpolate and extrapolate additional values associated with a curve.

A controller may combine the information associated with the fan curves 340, 350 with the information associated with the system curves 360, 370 to determine whether a component (e.g., filter) is installed. For example, an intersection 362 between the system curve 360 and the fan flow-pressure curve 340 may be used to determine a corresponding current 380 based on the fan flow-current curve 350. The performance characteristic of current 380 thus may be indicative of a component being installed in this system and fan. Similarly, an intersection 372 between the system curve 370 and the fan flow-pressure curve 340 may be used to determine a corresponding current 385 based on the fan flow-current curve 350. The performance characteristic of current 385 thus may be indicative of a component not being installed in this system and fan. Thus, the controller may interpret that a performance characteristic corresponding to current 380 indicates that the component is installed, and that current 385 may indicate that the component is not installed in the system. Similarly, the controller may use other performance characteristics, such as fan RPMs, voltage, duty cycle, and/or others in addition to and/or instead of current, to determine whether the component is installed. The controller may determine that the corresponding performance characteristic is within a range, without a need to identify a particularly precise and discrete value of the performance characteristic. For example, the controller may determine whether a performance characteristic corresponding to current is above or below 0.380 amps, without a need to identify the specific value.

In an example, the controller may monitor a performance characteristic (e.g., current) associated with the fan during operation. The controller may determine that the performance characteristic being monitored falls within a range that corresponds to the value of current 385. The controller may look up the fan flow-current curve 350 to determine a flow corresponding to the current 385. The controller may then determine if the flow is within a range of the intersection 372 (associated with the system curve 370 and fan flow-pressure curve 340) or the intersection 362 (associated with the system curve 360 and fan flow-pressure curve 340). If within range of the intersection 372, the controller may determine that the component is not installed and normal operation is achieved. If within range of the intersection 362, the controller may determine that the component is installed and normal operation is achieved. If not within range of the intersection 362 or 372, the controller may determine that an operational fault is present. The controller may identify additional information (e.g., what type of component and/or fault), based on how the flow corresponds to or deviates from any curves known to the controller and associated with the particular performance characteristic under consideration.

Figure 4:
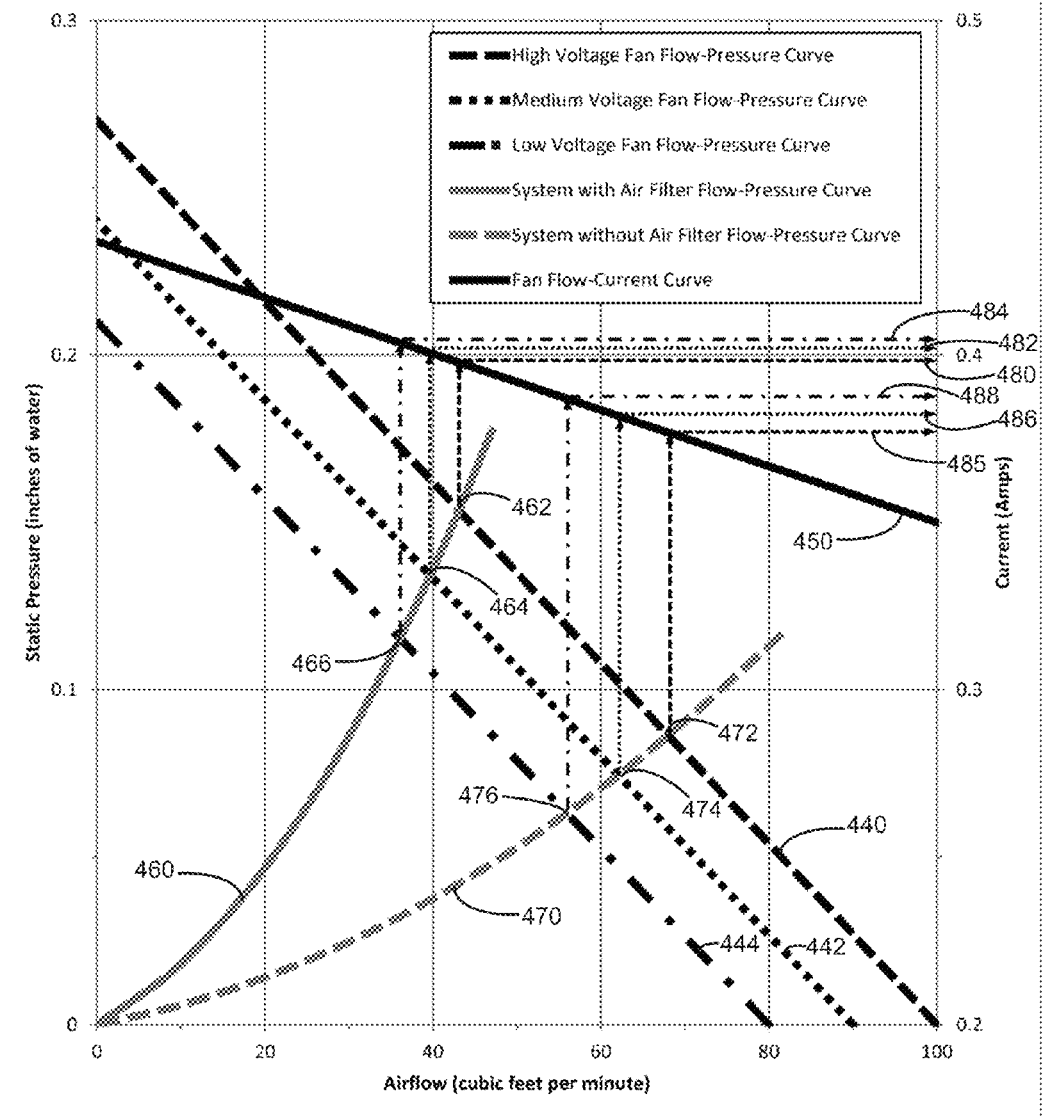
FIG. 4 is a chart based on fan performance at various voltages according to an example.

FIG. 4 is a chart based on fan performance at various voltages according to an example including a removable air filter component and a variable voltage fan. The fan may be associated with particular performance curves 440, 442, 444, and 450, and the computing system similarly may be associated with particular performance curves 460 and 470. In the example of FIG. 4, the fan may be operated at low, medium, or high voltages corresponding to curves 440, 442, and 444. A controller may identify the values corresponding to the particular curves and their intersection points 462, 464, and 466

(associated with a component being installed) and intersection points 472, 474, and 476 (associated with a component not being installed).

Similar to the example of FIG. 3, a controller in the example of FIG. 4 may identify a performance characteristic (such as currents 480, 482, 484, 485, 486, and 488) and determine whether the performance characteristic corresponds to the curve 470 or curve 460 to determine whether a component is installed (curve 460). For example, the controller may determine whether the performance characteristic is within range of intersections 462, 464, 466, 472, 474, or 476, or a fault condition. The controller also may adjust a voltage of the fan to move the performance characteristic, including moving the performance characteristic between curves 440, 442, and 444. Furthermore, the currents 485, 486, and 488 are clustered together, and the currents 480, 482, and 484 are clustered together. Thus, a controller may identify whether a performance characteristic is near the upper or lower cluster of ranges (thereby determining whether installed per curves 460 and 470), without a need to specifically identify the precise discrete value of the performance characteristic. Similarly, the controller may determine whether the system is operating normally without a component installed, or experiencing a fault condition.

Figure 5:
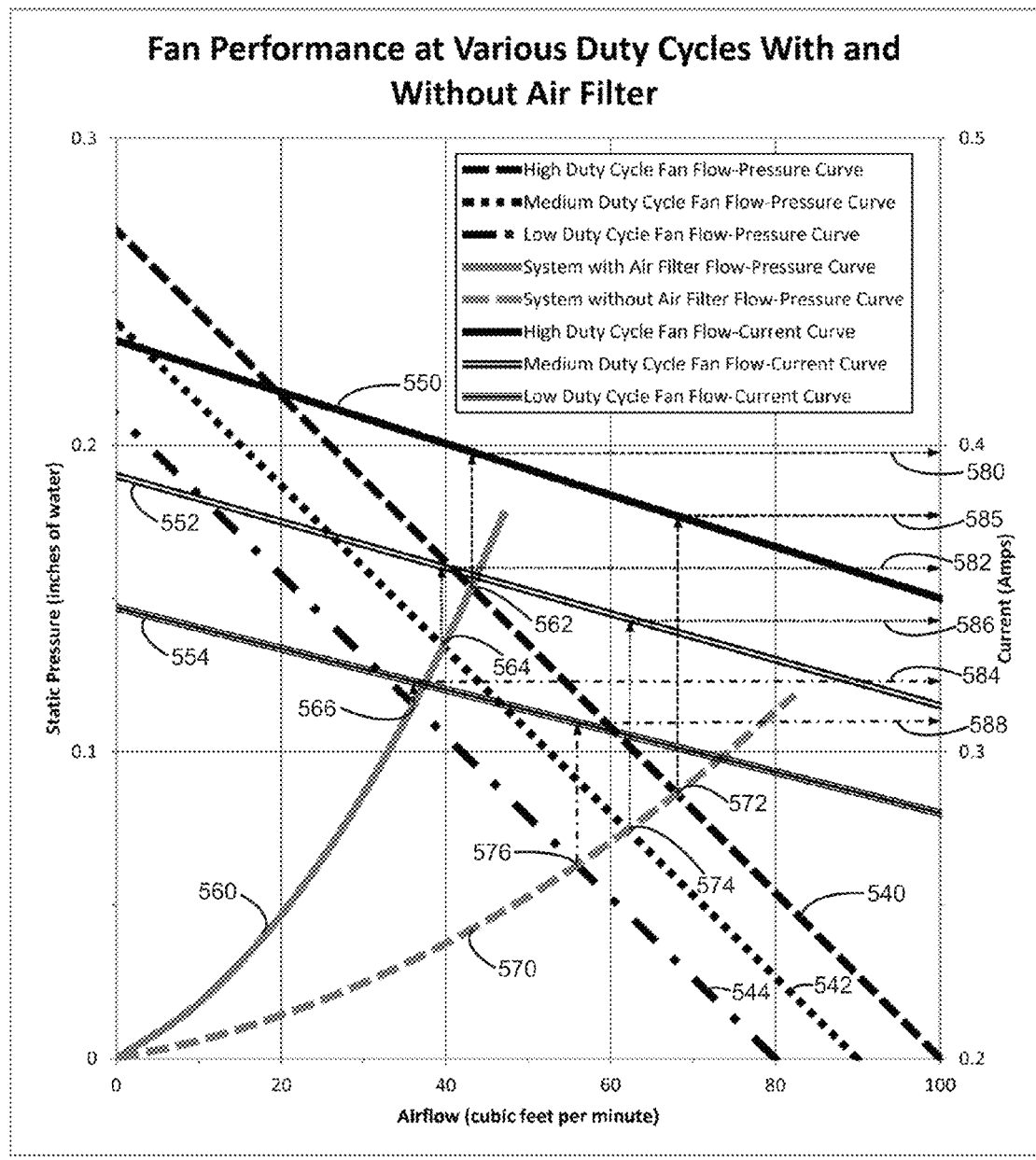
FIG. 5 is a chart based on fan performance at various duty cycles according to an example.

FIG. 5 is a chart based on fan performance at various duty cycles according to an example including a removable air filter component and a variable duty cycle (e.g., PWM) fan. The fan may be associated with particular performance curves 540, 542, 544, 550, 552, and 554. The computing system similarly may be associated with particular performance curves 560, 570. In the example of FIG. 5, the fan may be a Pulse Width Modulated (PWM) fan that may be operated at low, medium, or high duty cycles corresponding to curves 540, 542, 544, 550, 552, and 554. A controller may identify the values corresponding to the particular curves, theft intersection points 562, 564, 566 (associated with a component being installed per system curve 560), and intersection points 572, 574, and 576 (associated with a component not being installed per system curve 570).

Similar to the example of FIG. 4, a controller in the example of FIG. 5 may identify a performance characteristic (such as currents 580, 582, 584, 585, 586, and 588) and determine whether the performance characteristic corresponds to system curve 570 or system curve 560 to determine whether a component is installed, not installed, or if the system is experiencing a fault condition. The controller may adjust the duty cycle of the fan to move the performance characteristic, including moving the performance characteristic between curves 540, 542, 544, 550, 552, and/or 554.

Figure 6:
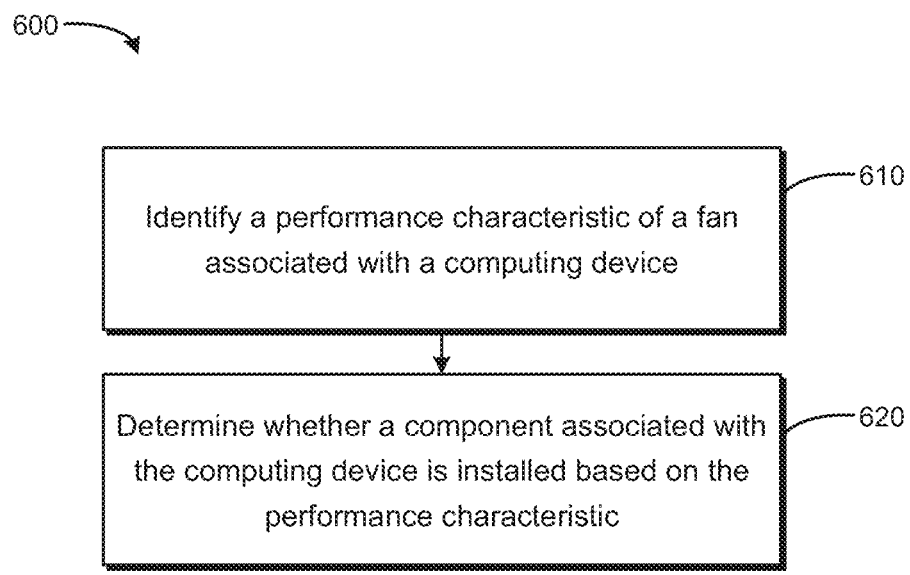
FIG. 6 is a flowchart based on identifying a performance characteristic of a fan according to an example.

FIG. 6 is a flowchart 600 based on identifying a performance characteristic of a fan according to an example. In block 610 a controller may identify a performance characteristic of a fan associated with a computing device. For example, the controller may identify a current, voltage, or duty cycle of the fan. In block 620, the controller may determine whether a component associated with the computing device is installed based on the performance characteristic. For example, the controller may determine whether an operational current associated with the fan corresponds to a system curve with a component installed or a system curve without a component installed. Additionally, the controller may adjust the fan operation or other system parameters to ensure normal system operation.

What is claimed is:

1. A method implemented by a computing system comprising at least one processor, the method comprising:
   the at least one processor identifying a performance characteristic of a fan associated with the computing system;
   the at least one processor determining whether an installable component associated with the computing system fan is installed based on the performance characteristic; and
   the at least one processor operating the computing system fan according to:
      a first set of operational parameters when the installable component is not installed; and
      a second set of operational parameters when the installable component is installed.

2. The method of claim 1, further comprising determining a type of the component based on the performance characteristic.

3. The method of claim 1, further comprising identifying an operational fault based on the performance characteristic.

4. The method of claim 1, further comprising generating an indication based on the performance characteristic.

5. The method of claim 1, further comprising adjusting operation of the fan in response to determining whether the component is installed.

6. A computing system comprising:
   a fan; and
   a controller that:
      identifies a performance characteristic of the fan;
      determines whether an installable component associated with the fan is installed based on the performance characteristic; and
      operates the computing system fan according to:
         a first set of operational parameters when the installable component is not installed; and
         a second set of operational parameters when the installable component is installed.

7. The computing system of claim 6, wherein the component is a filter.

8. The computing system of claim 6, wherein the component is an opacity shield.

9. The computing system of claim 6, wherein the controller is to adjust a duty cycle of the fan in response to the component being installed.

10. The computing system of claim 6, wherein the controller is to adjust a voltage of the fan in response to the component being installed.

11. A computing system comprising:
    a fan; and
    a controller that:
       determines whether an installable filter associated with the fan is installed based on a performance characteristic of the fan; and
       operates the computing system fan according to:
          a first set of operational parameters when the installable component is not installed; and
          a second set of operational parameters when the installable component is installed, wherein the operation of the computing system fan is adjusted based on feedback from the computing system fan.

12. The computing system of claim 11, wherein the controller is to determine what type of filter is installed based on the performance characteristic.

13. The computing system of claim 11, wherein the performance characteristic is air restriction.

14. The computing system of claim 11, wherein the performance characteristic is current drawn by the fan.

15. The computing system of claim 11, wherein the controller is a processor of the computing system.

\* \* \* \* \*